United States Patent [19]
Hartley

[11] Patent Number: 6,028,466
[45] Date of Patent: Feb. 22, 2000

[54] INTEGRATED CIRCUIT INCLUDING HIGH TRANSCONDUCTANCE VOLTAGE CLAMP

[75] Inventor: Paul Keith Hartley, Allentown, Pa.

[73] Assignee: Lucent Technologies Inc., Murray Hill, N.J.

[21] Appl. No.: 09/019,407

[22] Filed: Feb. 5, 1998

[51] Int. Cl.[7] .................................................... H03K 5/08
[52] U.S. Cl. .......................................... 327/328; 327/309
[58] Field of Search .................................... 327/309, 530, 327/538, 540, 327, 328, 306; 323/312, 313, 315

[56] References Cited

U.S. PATENT DOCUMENTS

| | | | |
|---|---|---|---|
| 4,849,708 | 7/1989 | Brehmer et al. | 330/110 |
| 5,491,437 | 2/1996 | Rincon et al. | 327/108 |
| 5,563,553 | 10/1996 | Jackson | 331/57 |
| 5,625,281 | 4/1997 | Lambert | 323/315 |

OTHER PUBLICATIONS

P. E. Allen et al., *CMOS Analog Circuit Design*, Saunders College Publishing, pp. 227–239 (1987).

N. Mohan et al., *Power Electronics: Converters, Applications and Design*, John Wiley & Sons, pp. 296–297 (1989).

*Primary Examiner*—Jung Ho Kim
*Attorney, Agent, or Firm*—David L. Smith

[57] ABSTRACT

An IC includes a clamp transistor for limiting the voltage at a circuit node and a current amplifier coupled across the input and output terminals of the clamp transistor. In one embodiment the current amplifier comprises a current mirror. In a differential line driver, the direction of current through a load is controlled by means of pair of dual-function transistors which also serve to provide current gain in separate current mirrors.

8 Claims, 3 Drawing Sheets

6,028,466

INTEGRATED CIRCUIT INCLUDING HIGH TRANSCONDUCTANCE VOLTAGE CLAMP

FIELD OF THE INVENTION

This invention relates generally to integrated circuits (ICs) in which the voltage at a circuit node is clamped or limited.

BACKGROUND OF THE INVENTION

A typical prior art voltage clamp, as shown in FIG. 1, utilizes a single PMOS transistor T1 to limit the voltage at output node N. In this circuit the output load, represented by resistor $R_L$, is driven by a current source I. When the output voltage at node N exceeds the input voltage by $V_{th}$ (the threshold voltage of T1), T1 turns on and begins to conduct current from node N to ground, effectively limiting the output voltage at node N to $V_{th}$ above the input voltage. Equivalent bipolar clamp circuits are also known in the prior art.

A significant disadvantage of the single-transistor clamp circuit arises from its limited transconductance, which in turn means that it does not turn on very hard; i.e., above $V_{th}$ the slope of its I-V characteristic is not as nearly vertical as desired. MOSFET transconductance is proportional to the gate width-to-length ratio (W/L). Since gate length is typically set by the design rules of a given IC process, increasing transconductance by a factor M generally implies increasing W by a similar factor. Unfortunately, this approach significantly increases the area of the MOSFET, area which is frequently at a premium in state-of-the-art, densely packed ICs. Once again, similar considerations apply to bipolar clamp circuits.

Thus, a need remains in the art for a voltage clamp IC which provides increased transconductance without significantly increased circuit area as compared to single-transistor clamp circuits.

SUMMARY OF THE INVENTION

In accordance with one aspect of my invention, an IC includes a clamp transistor for limiting the voltage at a circuit node and a current amplifier coupled across the input and output terminals (e.g., the source and drain of a MOSFET, or the emitter and collector of a bipolar transistor) of the clamp transistor. In one embodiment the current amplifier comprises a current mirror.

In accordance with another aspect of my invention, the direction of current through a load is controlled by means of dual-function transistor which also serves to provide current gain in the current mirror. In one embodiment, a differential line driver includes a pair of such dual-function transistors in its clamp circuits.

BRIEF DESCRIPTION OF THE DRAWINGS

My invention, together with its various features and advantages, can be readily understood from the following more detailed description taken in conjunction with the accompanying drawing, in which.

DETAILED DESCRIPTION OF THE INVENTION

Figure 2:
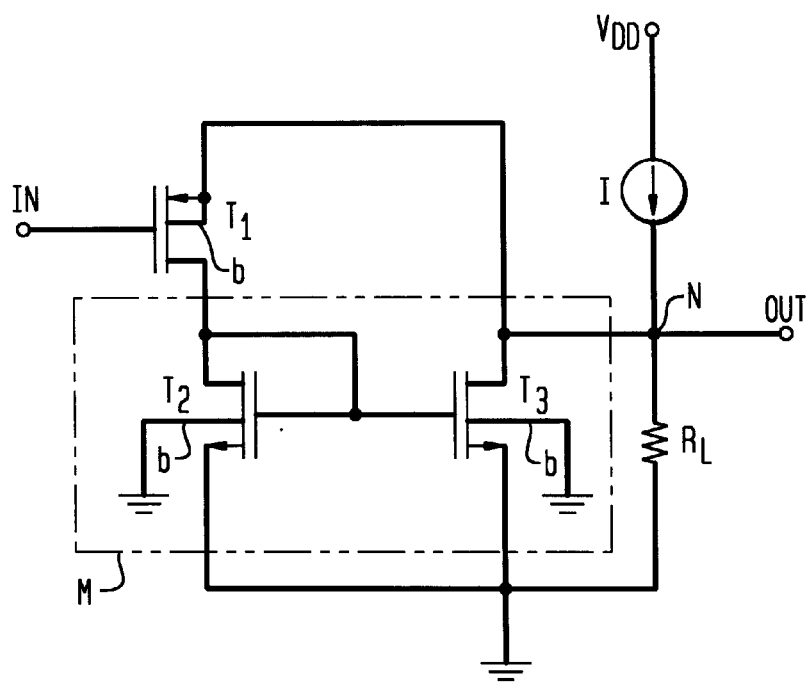
FIG. 2 is a circuit schematic of a clamp circuit in accordance with one embodiment of my invention.

With reference now to FIG. 2, a clamp circuit in accordance with one aspect of my invention comprises an output load $R_L$ driven by a current source I, and a MOSFET clamp transistor T1 for limiting the voltage at the output node N, characterized in that a current amplifier M is coupled across the source and drain of the clamp transistor T1.

Figure 1:
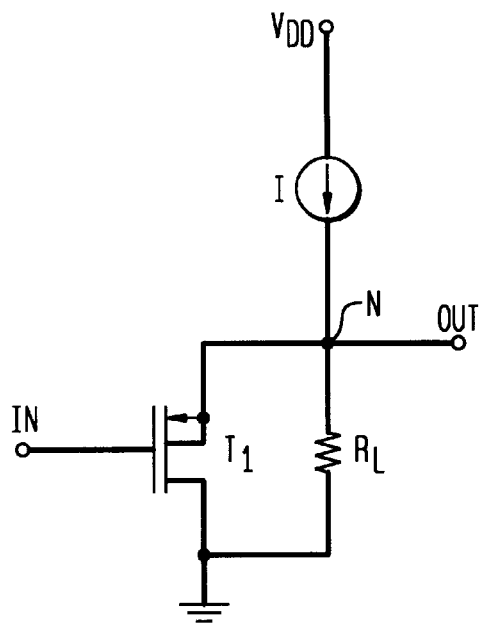
FIG. 1 is a circuit schematic of a prior art, single-transistor clamp circuit.

In one embodiment, the current amplifier M comprises a current mirror of the type described by P. E. Allen et al., *CMOS Analog Circuit Design*, Saunders College Publishing, pp. 227–239 (1987), which is incorporated herein by reference. The current mirror comprises a pair of transistors, a diode-connected transistor T2 and a current gain transistor T3, which provide a current gain M given by $$M=(W_3/L_3)/(W_2/L_2), \quad (1)$$

where W and L are the gate width and length, respectively. This gain, which relates the current through T3 to that through T2, effectively increases the transconductance of the clamp transistor T1 by the factor M and decreases its output impedance by the same factor. Accordingly, the slope of I-V characteristic of my clamp circuit above the threshold of T1 is steeper than that of the prior art single transistor circuit of FIG. 1.

In order to appreciate how incorporation of the current mirror into the clamp circuit can be exploited to increase transconductance and yet effect savings in circuit area (compared with the single-transistor clamp circuit of FIG. 1) consider the following. Assume all gate lengths are the same: $L_1=L_2=L_3=1$ μm, and that the gate widths are: $W_1=W_3=100$ μm and $W_2=1$ μm. Then, the clamp current (ie., the current in the left branch (in T1 and T2) plus the current in the right branch (in T3)) is approximately 101 times the current through T1 and T2. The single-transistor clamp circuit of FIG. 1 would require a MOSFET having a gate width 101 times that of T1 to achieve the same performance (or equivalently multiple MOSFETs with smaller, series-connected gates adding up to the necessary overall gate width). Using MOSFET gate area as a measure of chip area, such a single-transistor clamp circuit would require an area of 100 μm×101×1 μm=10,100 μm². In contrast, the inventive clamp circuit of FIG. 2 occupies an area of only (100 μm+100 μm+1 μm)×1 μm=201 μm², more than 50 times smaller than the equivalent-performance, single-transistor clamp circuit.

The connections between the current mirror M and the clamp transistor T1 are more specifically described as follows. An input signal is coupled to the gate of T1 which has its source coupled to the drain of T3 and to output node N. The drains of T1 and T3 are coupled to one another and to the gates of T2 and T3. The gates of T2 and T3 are also coupled to one another. The sources of T2 and T3 are coupled to a source of reference potential, illustratively shown to be ground. Current source I is coupled between bias voltage $V_{DD}$ and node N, whereas load $R_L$ is coupled between node N and ground. As is well known in the IC art, MOSFETs actually have a fourth terminal; i.e., the bodies b of the three transistors are coupled to ground in the case of T2 and T3 and to the source in the case of T1. In general, the term body may refer to the substrate or to a tub region in which the device is formed.

Figure 3:
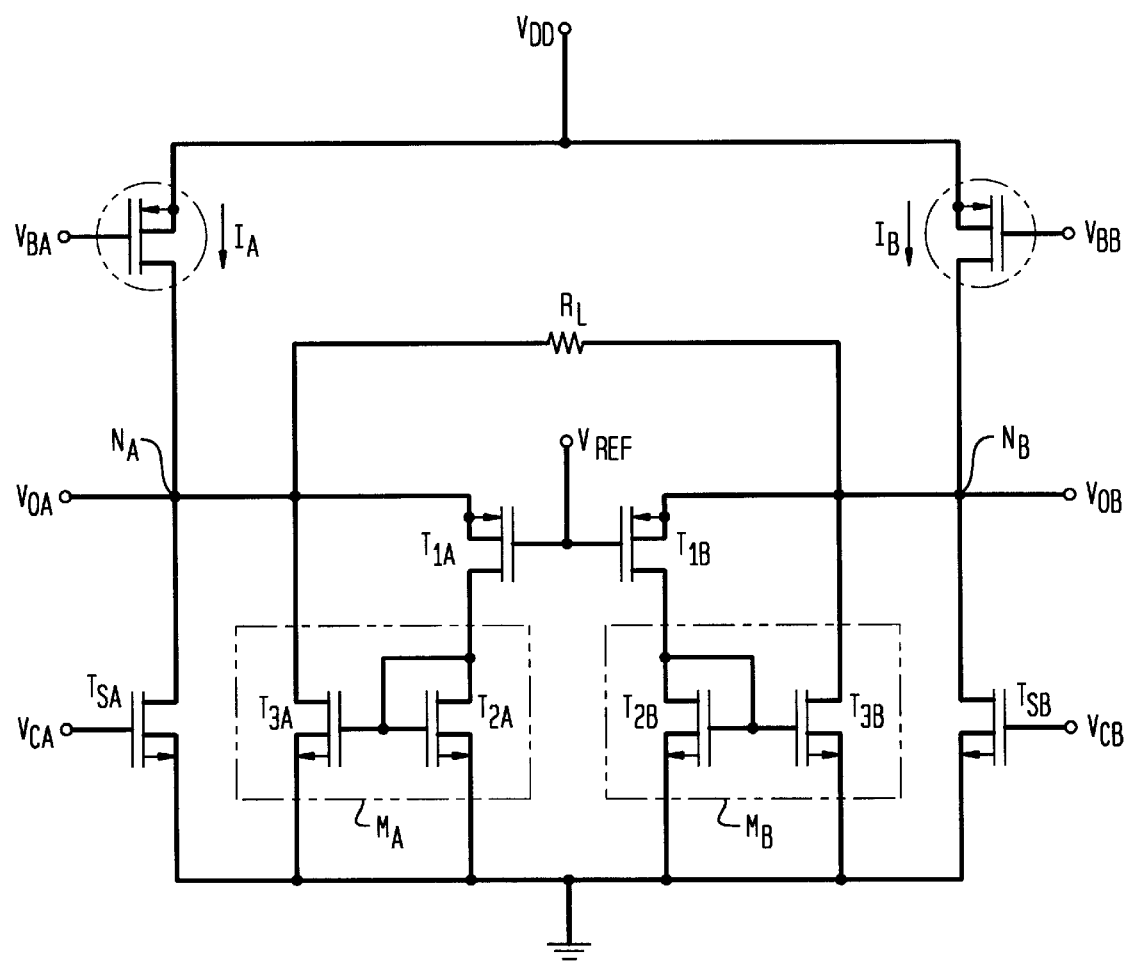
FIG. 3 is a circuit schematic of a differential line driver incorporating a clamp circuit in accordance with another embodiment of my invention.
Figure 4:
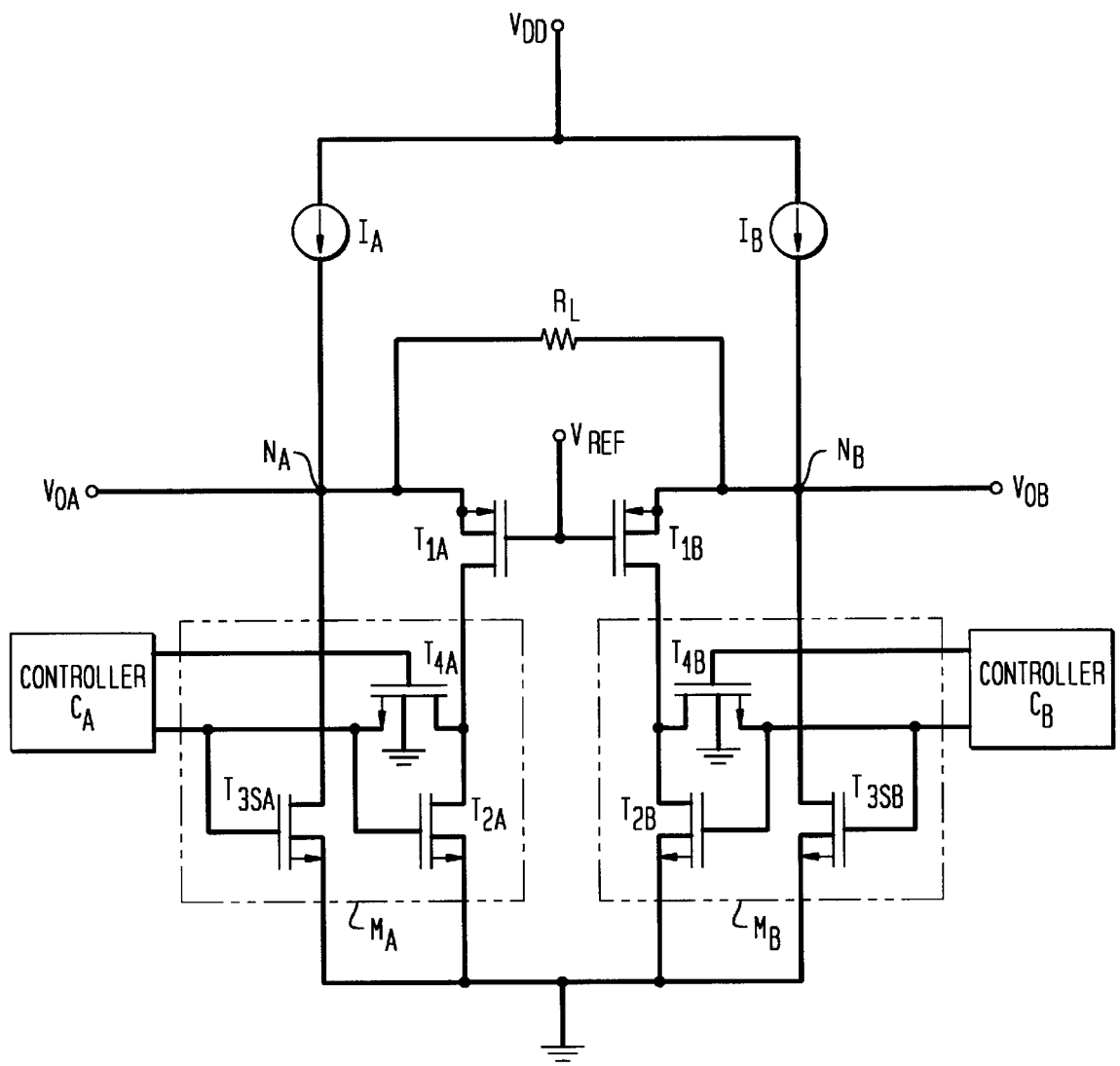
FIG. 4 is a circuit schematic of another differential line driver in which dual function transistors are utilized to switch the load and provide clamp current amplification in accordance with yet another embodiment of my invention.

My inventive clamp circuit finds utility in many applications including, for example, the differential line drivers depicted in FIGS. 3 and 4. These drivers, in turn, may be used in terminal adapters (internal or external) which interface between a work station or personal computer and the ISDN portion of a communication network. In such an adapter the driver outputs are typically coupled through a step-down transformer to a 50 ohm transmission cable (which would constitute the load $R_L$).

From a structural standpoint, the differential line driver of FIG. 3 may be viewed as having left-right circuit symmetry, with components on the left labeled A and corresponding ones on the right labeled B. From a functional standpoint, the driver alternates among multiple states responsive to control circuitry not shown. For example, in one state $S_c$ the driver is off (i.e., current sources $I_A$ and $I_B$ and switching transistors $T_{SA}$ and $T_{SB}$ are all off) and the output nodes are at a relatively high impedance. On the other hand, in states $S_A$ and $S_B$ the driver is on and provides output voltages $V_{OA}$ and $V_{OB}$ which are equal in magnitude but opposite in sign so that the average DC output is zero. In one system protocol the outputs of states $S_A$ and $S_B$ correspond to logic zero, whereas the output of state $S_C$ corresponds to logic one.

In operation, in state $S_A$, the driver is on; i.e., control signals $V_{CA}$=ground and $V_{CB}=V_{DD}$, whereas $V_{BB}=V_{DD}$ and $V_{BA}$ is a bias voltage necessary to provide the specified output current. The control signals turn switching transistor $T_{SA}$ off (and turn $T_{SB}$ on), causing current to flow from current source $I_A$ through the load in one direction (left-to right), through switching transistor $T_{SB}$ to ground. In state $S_A$, when $V_{OA}$ is $V_{th}$ above $V_{REF}$, clamp transistor $T_{1A}$ begins to conduct current from node $N_A$ through current mirror $M_A$ to ground (instead of through the load), thereby limiting/clamping the voltage at output node $N_A$ at a pre-determined level. Conversely, in state $S_B$ control signals $V_{CA}$ and $V_{CB}$ turn on switching transistor $T_{SA}$ (and turn off $T_{SB}$) so that current flows from current source $I_B$ through the load in the opposite direction (right-to-left), and through switching transistor $T_{SA}$ to ground. In state $S_B$, when transistor $T_{1B}$ conducts current from node $N_B$ through current mirror $M_B$ to ground, transistor $T_{1B}$ limits/clamps the voltage at output node $N_A$ in the same fashion as described above.

Careful observation of the operation of the driver of FIG. 3 reveals that in state $S_A$ switching transistor $T_{SA}$ is off. Hence it is not being utilized, yet it occupies circuit area. Further observation points out that $T_{SA}$ is in parallel with the current gain transistor $T_{3A}$ of current mirror $M_A$. Thus, the current gain and switching functions could be performed by single, dual-function transistor. This transistor is designated $T_{3SA}$ in the differential driver of FIG. 4. Likewise, transistors $T_{3B}$ and $T_{SB}$ of FIG. 3 may be replaced with the single, dual-function transistor $T_{3SB}$ shown in FIG. 4. Of course, to provide the current gain required of current mirrors $M_A$ and $M_B$, transistors $T_{3SA}$ and $T_{3SB}$ would have relatively large gate widths (similar to the gate widths of transistors $T_{3A}$ and $T_{3B}$ of FIG. 3). Functionally, the transistor $T_{3SA}$ is considered to be a dual function device in that in state $S_A$ it provides current gain and a relatively high impedance between node $N_A$ and ground, whereas in state $S_B$ it provides no current gain and a relatively lower impedance (effectively a short circuit) between node $N_A$ and ground. The impedance in state $S_A$ depends on the amount by which the output voltage $V_{OA}$ is more than $V_{th}$ above the predetermined maximum voltage at node $N_A$. Similar comments apply to transistor $T_{3SB}$ with respect to the converse situation.

An additional modification of the driver of FIG. 3 is the replacement of the gate-to-drain short circuits of transistors $T_{2A}$ and $T_{2B}$ with the switching transistors $T_{4A}$ and $T_{4B}$ of FIG. 4 under the control of controllers $C_A$ and $C_B$, respectively. In state $S_A$, when current mirror $M_A$ provides current gain, $T_{4A}$ is on, effectively providing a short circuit between the gate and drain of $T_{2A}$, and $T_{4B}$ is off, effectively providing an open circuit between the gate and drain of $T_{2B}$. Conversely, in state $S_B$, when current mirror $M_B$ provides current gain, $T_{4B}$ is on, effectively providing a short circuit between the gate and drain of $T_{2B}$, and $T_{4A}$ is off, effectively providing an open circuit between the gate and drain of $T_{2A}$. This embodiment of my differential driver saves the circuit area occupied by transistors $T_{SA}$ and $T_{SB}$ of FIG. 3 and reduces parasitic capacitance at the output nodes. Note, the additional logic MOSFETs (e.g., $T_{4A}$ and $T_{4B}$ and any logic circuitry in the controllers) are considerably smaller than the other transistors, and as such are only a small portion of the total area of the circuit.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the use of MOSFETs in the description of my invention is exemplary only; that is, bipolar and other types of transistors (e.g., MESFETs and JFETs) could also be utilized to build circuits incorporating my inventive principles. In addition, the gate and base terminals of these transistors may be considered to be control terminals, and accordingly the source/drain and emitter/collector terminals may be viewed as input/output terminals.

What is claimed is:

1. An integrated circuit including a clamp circuit for limiting the voltage at a circuit node, said clamp circuit comprising
    a current source coupled to said node, and
    a clamp transistor having a control terminal and a pair of input/output terminals, one of said input/output terminals being coupled to said node for limiting the voltage at said node when said clamp transistor conducts, said control terminal being responsive to a control signal and said node voltage being a function of said control signal, characterized in that
    a current amplifier is coupled across said input/output terminals of said clamp transistor, said amplifier comprising a current mirror that includes a diode-connected transistor coupled in series with said clamp transistor, a current gain transistor coupled in parallel with the series combination of said clamp transistor and said diode-connected transistor, the control terminals of said diode-connected transistor and said current gain transistor being coupled to one another.

2. The invention of claim 1 wherein said transistors are MOSFETs and the gate widths of said clamp transistor and said current gain transistor are much greater than the gate width of said diode-connected transistor.

3. An integrated circuit including a differential line driver circuit for providing, in one state, current flow through a load in one direction, and, in another state, current flow through the load in the opposite direction, said line driver circuit comprising
    first and second current sources for delivering current to a load, said sources being coupled to first and second output nodes,
    first and second switching transistors coupled between said first and second nodes, respectively, and a source of reference potential, first and second clamp transistors for limiting the voltage at said first and second nodes, respectively, first and second current amplifiers coupled in parallel with said first and second clamp transistors, respectively, and control circuitry for closing said first switching transistor in said one state so that current flows from said second current source through said load in one direction, through said second clamp transistor and said second current amplifier to said source of reference potential, and for closing said second switching transistor in said other state so that current flows from said first current source, through said load in the opposite direction, through said first clamp transistor and said first current amplifier to said source of reference potential.

4. The invention of claim 3 wherein each of said current amplifiers comprises a current mirror.

5. The invention of claim 4 wherein each of said current mirrors comprises a diode-connected transistor coupled in series with said clamp transistor, a current gain transistor coupled in parallel with the series combination of said clamp transistor and said diode-connected transistor, the control terminals of said diode-connected transistor and said current gain transistor being coupled to one another.

6. The invention of claim 5 wherein said transistors are MOSFETs and the gate widths of said clamp transistor and said current gain transistor are much greater than the gate width of said diode-connected transistor.

7. The invention of claim 5 wherein said first switching transistor and said first current gain transistor comprise a single, dual-function transistor, and said second switching transistor and said second current gain transistor also form a single, dual-function transistor.

8. The invention of claim 7 wherein each of said diode-connected transistors includes a switching transistor being coupled between the control terminal and one of the input/output terminals of said diode-connected transistors, the control terminals of said switching transistors and said diode connected transistors being coupled to said control circuitry.

* * * * *